(12) United States Patent
Wang

(10) Patent No.: US 10,916,583 B2
(45) Date of Patent: Feb. 9, 2021

(54) MONOLITHIC INTEGRATED CIRCUITS WITH MULTIPLE TYPES OF EMBEDDED NON-VOLATILE MEMORY DEVICES

(71) Applicant: INTEL CORPORATION, Santa Clara, CA (US)

(72) Inventor: Yih Wang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/464,023

(22) PCT Filed: Dec. 27, 2016

(86) PCT No.: PCT/US2016/068667
§ 371 (c)(1),
(2) Date: May 24, 2019

(87) PCT Pub. No.: WO2018/125038
PCT Pub. Date: Jul. 5, 2018

(65) Prior Publication Data
US 2019/0386062 A1     Dec. 19, 2019

(51) Int. Cl.
*H01L 27/22* (2006.01)
*G11C 5/06* (2006.01)
(Continued)

(52) U.S. Cl.
CPC ............ *H01L 27/228* (2013.01); *G11C 5/063* (2013.01); *H01L 27/2436* (2013.01);
(Continued)

(58) Field of Classification Search
CPC ... H01L 27/228; H01L 27/2436; H01L 43/04; H01L 43/065; H01L 43/08; H01L 43/10;
(Continued)

(56) References Cited

U.S. PATENT DOCUMENTS

2003/0107915 A1* 6/2003 Kim ................... G11C 11/5607
365/158
2004/0082117 A1 4/2004 Kastner et al.
(Continued)

FOREIGN PATENT DOCUMENTS

WO   2014204492        12/2014
WO   2014209278 A1    12/2014
(Continued)

OTHER PUBLICATIONS

International Search Report and Written Opinion received for PCT/US2016/068667. dated Sep. 12, 2017. 10 pages.
(Continued)

*Primary Examiner* — Bitew A Dinke
(74) *Attorney, Agent, or Firm* — Schwabe, Williamson & Wyatt, P.C.

(57) ABSTRACT

Circuits are described that use metallization on both sides techniques to integrate two different types of non-volatile embedded memory devices within a single monolithic integrated circuit device. In an embodiment, a monolithic integrated circuit structure is provided that includes a device layer having one or more logic transistors. A front side interconnect layer is provided above the device layer, as seen in a vertical cross-section taken through the monolithic integrated circuit from top to bottom. A back side interconnect layer is provided below the device layer, as seen in the vertical cross-section. A first type of non-volatile memory device is provided in the front side interconnect layer, and a second type of non-volatile memory device different from the first type of non-volatile memory device is provided in the back side interconnect layer. A back side contact may be used to connect the device layer to a back side interconnect layer.

20 Claims, 7 Drawing Sheets

(51) Int. Cl.
*H01L 27/24* (2006.01)
*H01L 43/04* (2006.01)
*H01L 43/06* (2006.01)
*H01L 43/08* (2006.01)
*H01L 43/10* (2006.01)
*H01L 43/14* (2006.01)
*H01L 45/00* (2006.01)

(52) U.S. Cl.
CPC ............ *H01L 43/04* (2013.01); *H01L 43/065* (2013.01); *H01L 43/08* (2013.01); *H01L 43/10* (2013.01); *H01L 43/14* (2013.01); *H01L 45/1206* (2013.01); *H01L 45/1253* (2013.01); *H01L 45/146* (2013.01); *H01L 45/1608* (2013.01)

(58) Field of Classification Search
CPC . H01L 43/14; H01L 45/1206; H01L 45/1253; H01L 45/146; H01L 45/1608; H01L 45/08; H01L 45/1233; G11C 5/063
See application file for complete search history.

(56) References Cited

U.S. PATENT DOCUMENTS

| | | | |
|---|---|---|---|
| 2005/0207263 A1* | 9/2005 | Okayama | G11C 11/16 365/232 |
| 2009/0174015 A1 | 7/2009 | Gu et al. | |
| 2010/0181547 A1* | 7/2010 | Kuroda | H01L 27/2436 257/2 |
| 2010/0296347 A1 | 11/2010 | Park et al. | |
| 2013/0134383 A1 | 5/2013 | Hwang et al. | |
| 2013/0134499 A1 | 5/2013 | Tatsumura et al. | |
| 2014/0332749 A1* | 11/2014 | Yokoyama | H01L 21/845 257/4 |
| 2014/0346624 A1* | 11/2014 | Shoji | H01L 43/02 257/421 |
| 2014/0353662 A1* | 12/2014 | Shukh | H01L 27/2436 257/43 |
| 2015/0091098 A1 | 4/2015 | Huang et al. | |
| 2016/0268344 A1* | 9/2016 | Lin | H01L 23/481 |
| 2017/0092692 A1* | 3/2017 | Kalnitsky | H01L 43/12 |
| 2017/0287905 A1 | 10/2017 | Morrow et al. | |
| 2017/0301728 A1* | 10/2017 | Chuang | H01L 27/228 |
| 2017/0301856 A1* | 10/2017 | Chuang | H01L 43/02 |
| 2018/0240797 A1* | 8/2018 | Yokoyama | H01L 21/823475 |
| 2018/0277594 A1* | 9/2018 | Kanda | G11C 14/0081 |

FOREIGN PATENT DOCUMENTS

| | | |
|---|---|---|
| WO | 2017034563 A1 | 3/2017 |
| WO | 2017155508 A1 | 9/2017 |
| WO | 2018125038 A1 | 7/2018 |
| WO | 2019005129 A1 | 1/2019 |

OTHER PUBLICATIONS

International Preliminary Report on Patentability received for PCT/US2016/068667. dated Jul. 2, 2019. 6 pages.

Extended European Search Report received for EP Application No. 16925633.6, dated Jul. 1, 2020. 7 pages.

* cited by examiner

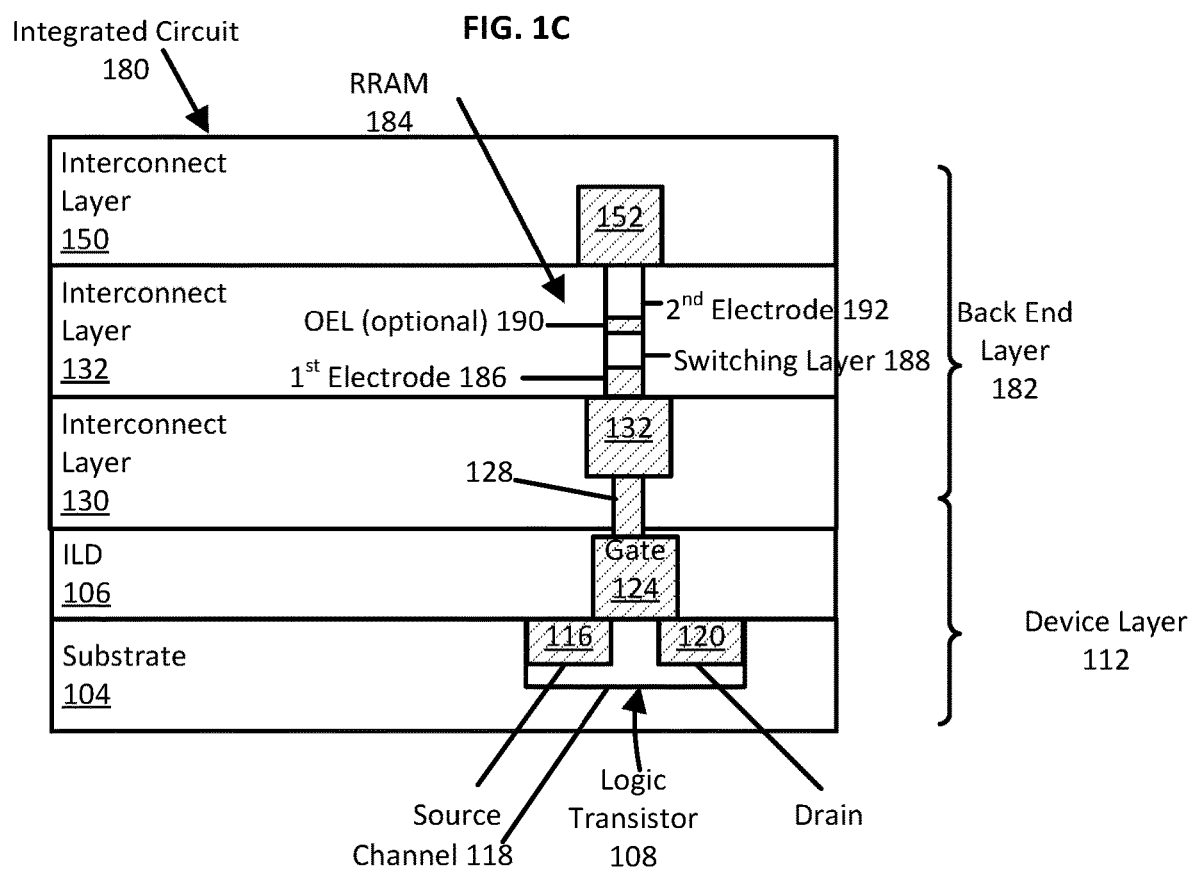

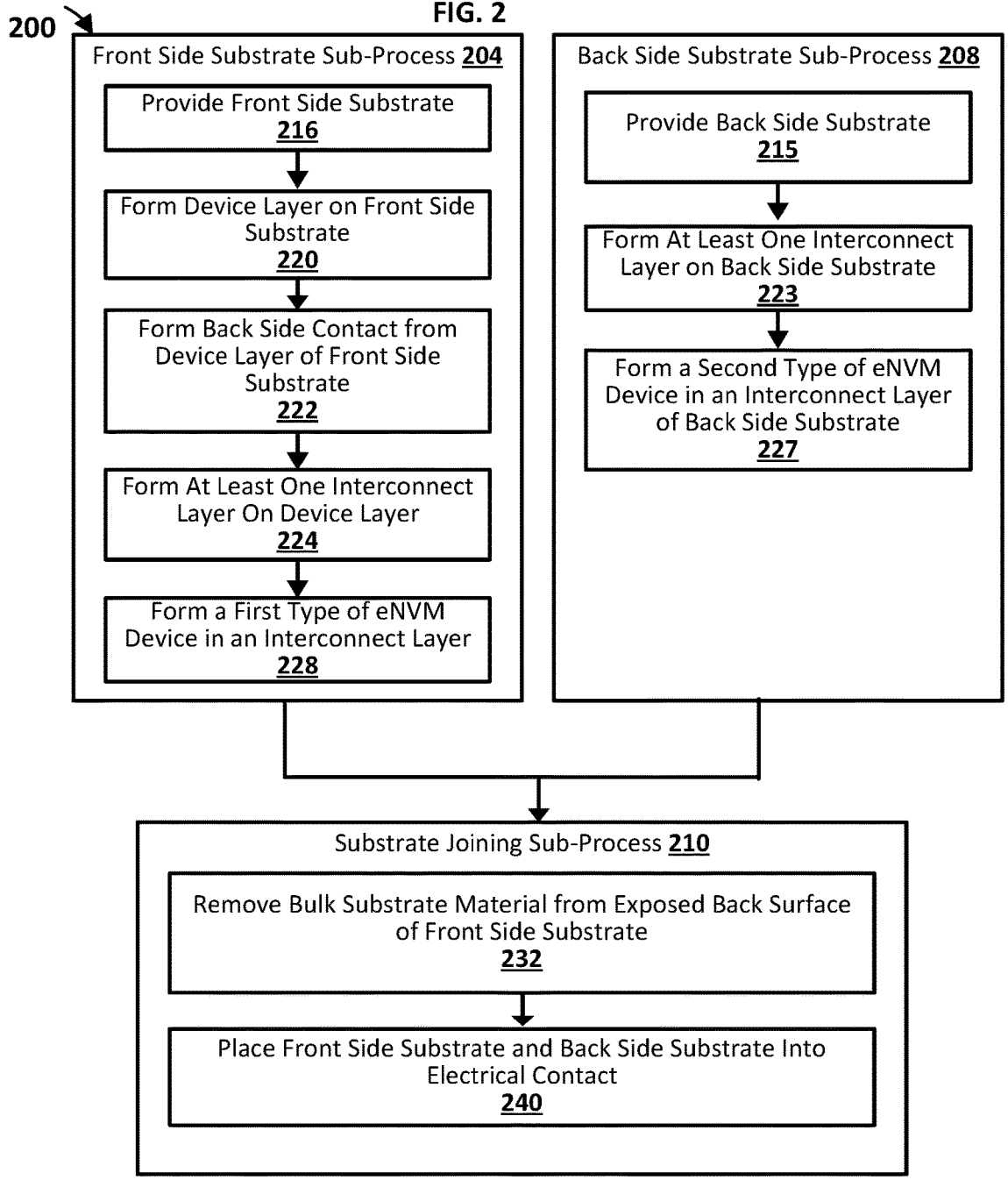

MONOLITHIC INTEGRATED CIRCUITS WITH MULTIPLE TYPES OF EMBEDDED NON-VOLATILE MEMORY DEVICES

BACKGROUND

Integration of non-volatile memory cells on a same substrate as logic transistors is often referred to as "embedded non-volatile memory" or "eNVM." Embedding non-volatile memory on a same substrate as logic transistors improves computational speed and efficiency compared to memory devices and semiconductor devices that are disposed on separate substrates and that therefore communicate through an inter-substrate bus. While common types of integrated memory devices include eDRAM and SRAM, various types of resistive and magneto-resistive random access memory (RRAM and MRAM, respectively) devices are of increasing interest, particularly for embedded non-volatile memory (eNVM) devices. Generally, MRAM devices store a bit of data by magnetizing or de-magnetizing a "free" layer of a magneto-resistive device. The electrical resistance of the free layer relative to an associated magnetized "fixed" or "reference" layer is then used to determine a binary value of "1" or "0" in the MRAM device. An analogous resistive, non-magnetic mechanism is used for RRAM devices. Because resistive data storage does not require periodic electrical refreshment, as do memory storage devices that use an electrical charge such as eDRAM and SRAM, the data stored in the RRAM and MRAM devices persists even after power is removed from the circuit. Examples of MRAM memory devices include, but are not limited to, spin hall effect magnetic random access memory (SHE-MRAM), and spin transfer torque MRAM (STT-MRAM).

BRIEF DESCRIPTION OF THE DRAWINGS

FIG. 1C is a schematic illustration of an example resistive random access memory device (RRAM) within an integrated circuit, in accordance with an embodiment of the present disclosure.

FIG. 2 is a flow diagram of an example method for fabricating a monolithic integrated circuit including two or more different types of eNVM devices, using metallization on back side ("MOBS") fabrication techniques, in accordance with an embodiment of the present disclosure.

Figure 1A:
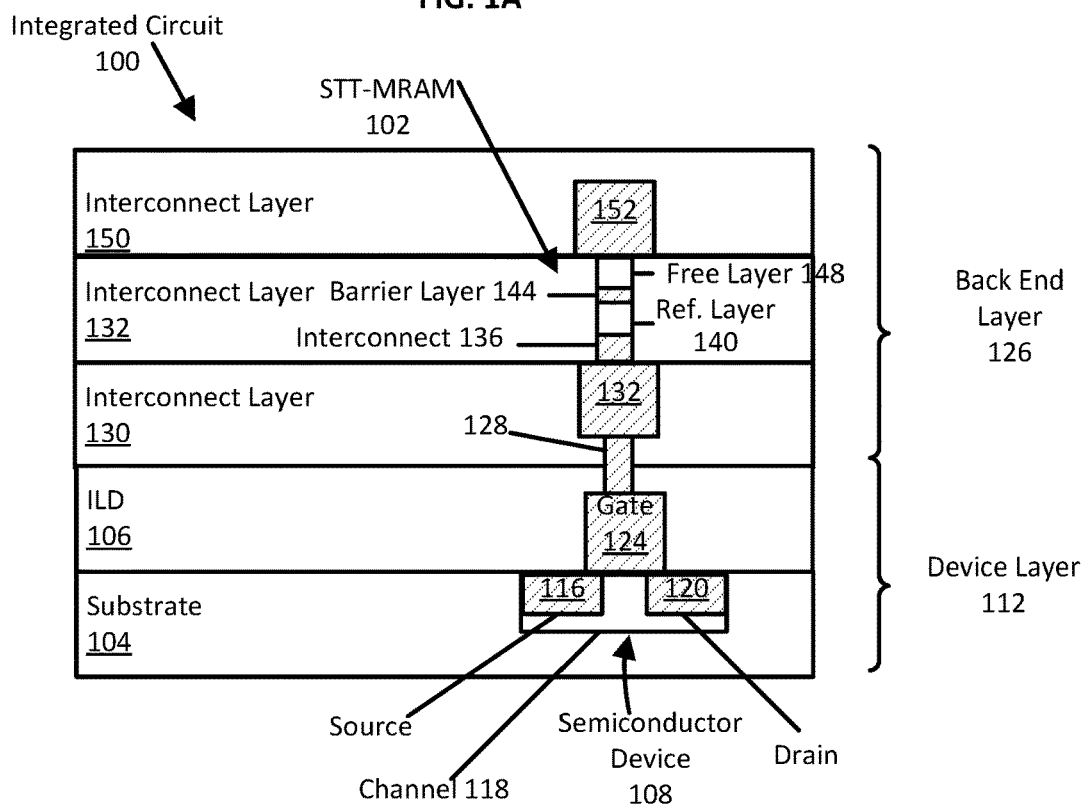
FIG. 1A is a schematic cross-sectional illustration of an example spin torque transfer magneto-resistive random access memory device (STT-MRAM) within an integrated circuit taken along a direction parallel to a gate of a transistor, in accordance with an embodiment of the present disclosure.

The figures depict various embodiments of the present disclosure for purposes of illustration only. Numerous variations, configurations, and other embodiments will be apparent from the following detailed discussion.

DETAILED DESCRIPTION

Techniques are disclosed for forming integrated circuits using "metallization on both sides" or "MOBS" so as to integrate two different types of embedded memory devices within a single monolithic integrated circuit. By using MOBS techniques, an embedded non-volatile ("eNVM") memory device of a first type can be integrated within a front side interconnect layer above a given device layer, and an eNVM memory device of a second type different from the first type can be integrated within a back side interconnect layer below the given device layer. The two structures including the diverse eNVM memory device types can be formed on separate substrates, and are then joined (one of the substrates can be removed or at least partially removed to facilitate the joining process) using MOBS processing, thereby placing the structures and devices thereon, including the two different types of eNVM devices, into electrical contact or an otherwise functional integrated circuit arrangement. An alternative characterization of this arrangement is simply a substrate having a device layer, a first side above the device layer and a second side that is on an opposite side of the device layer from the first side. A first type of eNVM device is disposed on the first side of the substrate ("above" the device layer as shown in the figures although it will be appreciated this term is used for convenience only). A second type of eNVM device different from the first type is disposed on the second side of the substrate ("below" the device layer as shown in the figures). Each eNVM device is associated with a bit line and a source, each of which is disposed on one of the first substrate or the second substrate.

The disclosed techniques may provide various advantages over integrated circuits that include only a single type of memory device integrated with semiconductor devices on a substrate. For example, because different types of eNVM devices have different advantages in different operational regimes, integrating at least two different types of eNVM devices within single monolithic integrated circuit can improve the overall computational efficiency of the integrated circuit by increasing data access efficiency and/or computational efficiency over a broader range of operational states.

It is noted that front side and back side designations are relative to a given orientation of the device layer, which may change during the MOBS processing scheme, as the device layer is inverted or flipped to accommodate further processing. Further note that when the monolithic integrated circuit structure is inverted, such that the device layer is effectively pointing down, the channels of the transistor devices in that device layer are, relatively speaking, above their respective gates, rather than below the gates as typically depicted. To this end, reference herein to "front side" or "back side" or "above" or "below" or "top" or "bottom" or "top side" or "bottom side" is not intended to necessarily implicate a limitation as to orientation of the monolithic structure. Rather, such terminology is simply used in a relative sense to consistently describe the structure as it exists in any one particular orientation. In reality, the monolithic structure can be turned and inverted and otherwise oriented as desired for a given application, and the relative terminology used herein can simply be adjusted to that actual orientation and still equally apply.

General Overview

Figure 1B:
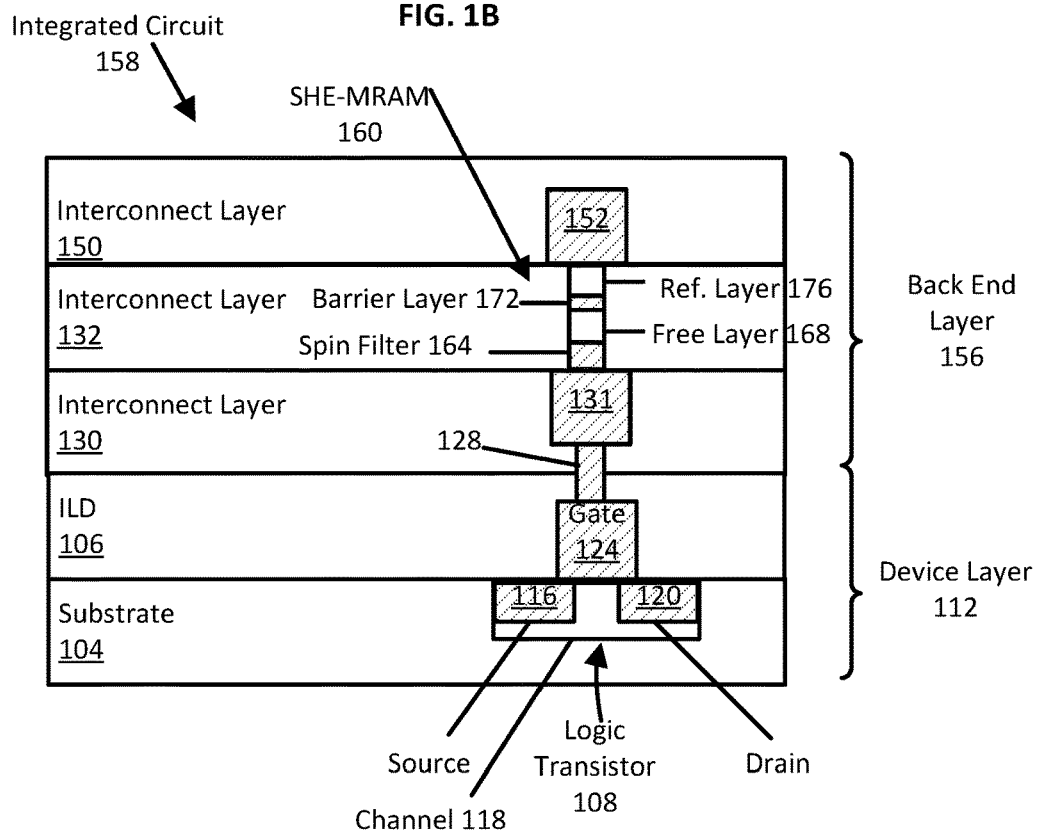
FIG. 1B is a schematic cross-sectional illustration of an example spin hall effect magneto-resistive random access memory device (SHE-MRAM) within an integrated circuit taken along a direction parallel to a gate of a transistor, in accordance with an embodiment of the present disclosure.

As will be appreciated in light of this disclosure, each type of eNVM device (e.g., RRAM and MRAM devices) has a different operational regime in which it may be more efficient and/or preferred. With the current logic process technology, however, different types of eNVM devices can't be integrated in the same substrate due to the conflicting requirement of manufacturing process for each type of eNVM technology. For example, as shown in FIGS. 1A and 1B, and explained below in more detail, the sequence of the layers in an STT-MRAM device 102 relative to a device layer is opposite of that of a sequence of layers in an SHE-MRAM device 160. For example, the sequence of a free layer and a reference layer (and thus the order in which the layers are formed during fabrication) are reversed in an STT-MRAM device (illustrated in FIG. 1A) relative to a device layer compared to an SHE-MRAM device (illustrated in FIG. 1B). This is because a free layer of a magnetic tunnel junction ("MTJ") transistor of STT-MRAM is placed on a side of a fixed layer opposite that of a device layer (i.e., proximate to a "higher" interconnect level) to improve device performance and manufacturing yields. In contrast, a free layer of an MTJ transistor of SHE-MRAM is placed "under" a fixed layer (i.e., proximate to a device layer and "lower" interconnect levels) so as to place free layer in contact with a spin filter. Forming two different compositions of layers for these different types of eNVM devices at a same interconnect layer within an integrated circuit makes fabrication of these devices challenging. Moreover, in some cases the different types of materials used in the various devices, the thermal processing applied to one type of an MRAM or RRAM device is not necessarily compatible with other types of eNVM devices. For example, the thermal processing used in the fabrication of an STT-MRAM device can degrade the materials that may be used to fabricate an SHE-MRAM device. Similarly, RRAM devices are generally not fabricated with either STT-MRAM or SHE-MRAM devices due to differences in the thermal processing of these devices. Another impediment to integrating multiple (i.e., two or more) types of eNVM devices on a same substrate is that the interconnects used to read data from and write data to the eNVM devices are generally configured to occupy similar locations within a back end layer of an integrated circuit. For example, generally for memory devices that are designed as "one transistor, one resistor" devices (1T/1R devices for brevity), it is preferred to connect the resistor (in this case, the MRAM device) to a corresponding transistor using, in part, low resistance interconnects. This generally involves interconnects (e.g., metal lines and/or vias) having dimensions larger than those found at interconnect levels more proximate to the device level. These relatively large interconnects have a lower electrical resistance compared to dimensionally smaller interconnects more proximate to a device level. However, the interconnects to different types of eNVM devices would compete for limited space within the same interconnect layers, thus further prohibiting integration of multiple different types of eNVM devices. This issue is further complicated for certain combinations of eNVM devices that cannot use a common interconnect because the signals conducted by the interconnect are different. That is, a common interconnect path may not be used in some cases because a read signal appropriately provided to a first type of eNVM device may not be appropriate to provide to a connected, but differently configured, second type of eNVM device.

Thus, and in accordance with an embodiment of the present disclosure, techniques are provided for forming monolithic integrated circuits that include two different types of eNVM devices. Example embodiments include monolithic integrated circuits that include any of the following combinations: (1) SHE-MRAM and STT-MRAM; (2) SHE-MRAM and RRAM; and (3) STT-MRAM and RRAM. More generally, other embodiments may include a device layer having front side interconnect configured with a first type of eNVM device, and a back side interconnect configured with a second type of eNVM device different from the first type. These various example embodiments are fabricated using "metal on both sides" or "MOBS" techniques. In this way, the different fabrication processes and material selections for different types of eNVM devices can be performed so as to integrate two different types of eNVM devices within a monolithic integrated circuit while avoiding the complications and issues indicated above.

The disclosed techniques of forming a monolithic integrated circuit that includes any two eNVM devices (e.g., SHE-MRAM, STT-MRAM, and RRAM) may provide various advantages. For example, the example embodiments described herein can reduce power consumption of an integrated circuit while improving performance of the integrated circuitry by enabling direct code execution by the integrated circuit. Furthermore, including any two eNVM devices (e.g., SHE-MRAM, STT-MRAM, and RRAM) within an integrated circuit provides different types of eNVM devices having different preferred operational regimes. Thus, the integrated circuit as a whole can perform computations more efficiently over a broader range of operational conditions. These broader ranges of conditions can include factors such as memory density, data retention at high temperatures, power consumption, and a speed at which data is written to or read from each of the eNVM devices. Other advantages will be apparent in light of this disclosure. Also, numerous variations and configurations will be apparent in light of this disclosure.

Embedded Non-Volatile Memory Device Configurations

FIGS. 1A, 1B, and 1C illustrate example configurations of embedded non-volatile memory devices STT-MRAM, SHE-MRAM, and RRAM, respectively. These three device types are referred to herein collectively as "eNVM," although as will be appreciated, the embodiments described herein may be applicable to different types of embedded memory devices. The eNVM configurations are presented for context prior to describing the integration of two different types of eNVM devices within a single monolithic integrated circuit as shown in in FIGS. 2, 3A-3C, 4A, and 4B.

Turning to FIG. 1A, an integrated circuit ("IC") 100 is shown that includes an STT-MRAM embedded non-volatile memory device 102 ("STT-MRAM" device for brevity) in electrical contact with other elements of the IC 100. The IC 100 is described below for convenience as having two portions: a device layer 112 and a back end layer 126. Each of these layers, the corresponding elements within each layer, including the STT-MRAM device 102, are described below in detail.

The device layer 112, comprising a semiconductor device 108 some or all of which is encapsulated in interlayer dielectric (ILD) 106, is fabricated on a substrate 104.

Examples of the substrate 104 include single crystal silicon substrates, whether oriented in any of the [111] direction, the [110] direction, or the [100] direction. Other types of substrates can be substituted for single crystal silicon. For example, the substrate 104 may also include a buried oxide (BOX) layer, or be a semiconductor-on-insulator (or "XOI" where X is any semiconductor) substrate. One specific XOI substrate example includes a blanket layer of silicon dioxide ($SiO_2$) with a silicon (Si) substrate. The presence or absence of an underlying oxide or insulator may affect the performance of other semiconductor devices in an integrated circuit associated with the resonators of the present disclosure, but generally will not affect the fabrication or performance of the MRAM memory devices described herein.

The ILD 106 is used to provide electrical insulation and mechanical integrity to semiconductor devices 108 fabricated within and/or on the substrate 104. Example insulator materials that can be used for the ILD 106 include, for instance, nitrides (e.g., $Si_3N_4$), oxides (e.g. $SiO_2$, $Al_2O_3$), oxynitrides (e.g., $SiO_xN_y$), carbides (e.g., SiC), oxycarbides, polymers, silanes, siloxanes, or other suitable insulator materials. In some embodiments, the ILD 106 is implemented with ultra-low-k insulator materials, low-k dielectric materials, or high-k dielectric materials depending on the application. Example low-k and ultra-low-k dielectric materials include porous silicon dioxide, carbon doped oxide (CDO), organic polymers such as perfluorocyclobutane or polytetrafluoroethylene, fluorosilicate glass (FSG), and organosilicates such as silsesquioxane, siloxane, or organosilicate glass. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Techniques for forming the ILD 106 can be any of a wide range of suitable deposition techniques, including but not necessarily limited to: physical vapor deposition (PVD); chemical vapor deposition (CVD); spin coating/spin-on deposition (SOD); and/or a combination of any of the aforementioned. Other suitable configurations, materials, deposition techniques, and/or thicknesses for ILD 106 will depend on a given application and will be apparent in light of this disclosure.

The semiconductor device 108, in this example, includes a source 116, a channel region 118, a drain 120, and a gate 124. Although the simple planar transistor depiction used to illustrate the semiconductor device 108 is presented for convenience, it will be appreciated that non-planar configurations of semiconductor device 108 are also possible. Examples of semiconductor devices that can be formed in device layer 112 include, but are not limited to, planar field effect transistors (FETs), and non-planar FETS (e.g., fin-FETs or nanowire FETs), capacitors (e.g., embedded DRAM (eDRAM) capacitors), DRAM devices, and SRAM devices, among others.

As will be appreciated, the actual devices implemented in the device layer 112 will depend on the target application and function of the integrated circuit 100, and the present disclosure is not intended to be limited to any particular application or functional circuitry. Rather, the techniques provided herein can be used with any number of device layer 112 configurations. These devices, often fabricated on and/or within a semiconducting substrate 104 are in electrical contact with at least one interconnect (described below). Fabrication of the semiconductor device 108 can be accomplished using one or more of ion implantation, epitaxial growth, sputtering, chemical vapor deposition (CVD), atomic layer deposition (ALD), photolithography, planarization techniques (e.g., chemical and/or mechanical polishing), among others. The source 116, channel 118, drain 120, and gate 124 need not be described in further detail.

Regardless of the configuration, the semiconductor device 108, and other semiconductor devices within the integrated circuit 100 and/or within other integrated circuits not shown in FIG. 1A, is connected to one or more interconnect structure(s). In the example shown in FIG. 1A, these interconnect structure(s) are disposed within a back end layer 126, which in this example comprises three interconnect layers 130, 132, and 150.

The interconnect layers 130, 132, and 150 are each shown as including one or two interconnects, whether a via or a conductive line or both. It will be appreciated that this depiction is for convenience only and that interconnect layers often include a plurality of one or both of vias or conductive lines. Regardless of the number or type of interconnects within an interconnect layer, interconnects, such as vias 128, 136 and conductive metal lines 131 and 152 connect a semiconductor device, such as semiconductor device 108 to other semiconductor devices elsewhere within an integrated circuit, or connect a semiconductor device to an electrical contact at an upper or lower layer of the integrated circuit 100, through a network of selectively connected vias and conductive lines. The vias and conductive lines are insulated from one another with ILD, which can be fabricated using any of the materials described above. With each successive layer of interconnect structures, generally greater numbers of semiconductor devices 108 can be connected together. Ultimately, the semiconductor devices, through a series of interconnect structures, are placed in electrical contact with an input and/or an output so that instructions and/or data can be received at and/or sent from the integrated circuit 100. The interconnect layers 130, 132, and 150, and the interconnect structures therein, can be fabricated using any of a variety of techniques that include, but are not limited to epitaxial growth, sputtering, chemical vapor deposition (CVD), atomic layer deposition (ALD), photolithography and other patterning techniques, and planarization techniques (e.g., chemical and/or mechanical polishing).

The interconnect layer 132, in the example shown in FIG. 1A, includes an STT-MRAM embedded non-volatile memory device 102. The STT-MRAM device 102 includes a reference layer 140, a barrier layer 144, and a free layer 148.

As indicated above, an STT-MRAM device, such as the device 102 shown in FIG. 1A, stores a bit of data by controlling an electrical resistance between the reference layer 140 and the free layer 148. This electrical resistance is changed by changing the spin polarization, and thus the angular momentum, of electrons within the free layer 148 relative to spin polarization of electrons in the reference layer 140. It will be appreciated that while STT-MRAM device 102 is shown as including one of each of the reference layer 140, barrier layer 144, and the free layer 148, other configurations of STT-MRAM devices may include many of each one of these layers. Furthermore, it will be appreciated that the STT-MRAM device 102 may be disposed within any interconnect layer (e.g., M1, M2, M3, M4) within the back end layer 126, although often an MTJ of an STT-MRAM devices are disposed at or above M3 (i.e., the third level of interconnect above a device layer, although alternative configurations in which the MTJ of a STT-MRAM device is disposed at M3 below a device layer will also be appreciated) so as to avoid exposing the STT-MRAM layers to the higher temperatures used earlier stages of IC 100 fabrication.

Continuing with the description of the STT-MRAM device 102, the reference layer 140 can, in some examples, be fabricated from a material or a stack of materials that maintains a magnetization polarity (i.e., a spin of electrons) and is a "hard" magnetic material having a magnetic coercivity higher than that of the free layer 148. Types of materials used to fabricate the reference layer 140 include permanent magnetic materials, such as ferromagnetic materials. In one example, the reference layer 140 is fabricated from a single layer of cobalt iron boron (CoFeB). In another example, the reference layer 140 is composed of a stack of materials that include a cobalt iron boron (CoFeB) layer, a ruthenium (Ru) layer, and a cobalt iron boron (CoFeB) layer. In an example, not shown, a synthetic antiferromagnet (SAF) layer is disposed on or adjacent to the reference layer 140. The reference layer 140 can be deposited using any of a variety of techniques including, but not limited to, chemical vapor deposition, atomic layer deposition, sputtering, among other deposition techniques.

The barrier layer 144 is generally a dielectric material configured to permit electrons to tunnel through it into the free layer 148. The barrier layer 144 can facilitate selective tunneling so that electrons having a preferred spin polarity can tunnel from the reference layer 140 through the barrier layer 144 into the free layer 148. This selective tunneling can be used to control the magnetization polarity of electrons in the free layer 148, and thus control the resistance of the STT-MRAM device 102. In some examples the barrier layer 144 is fabricated from magnesium oxide (MgO) or aluminum oxide ($Al_2O_3$) although other dielectric materials may also be used. The barrier layer 144 can be deposited using any of a variety of techniques including, but not limited to chemical vapor deposition, organometallic chemical vapor deposition, atomic layer deposition, sputtering, among other deposition techniques.

The free layer 148 is fabricated from a material that can switch between electron spin states, changing its magnetization polarity relative to the reference layer 140 and thus changing the resistance of the device. The free layer 148 can be fabricated from ferromagnetic materials including, but not limited to, cobalt iron (CoFe) or cobalt iron boron (CoFeB). The ferromagnetic material of the free layer 148 can be deposited using any of a variety of techniques including, but not limited to, epitaxial deposition, atomic layer deposition, so as to produce a single crystal ferromagnet having a uniform magnetization polarity.

FIG. 1B illustrates an integrated circuit 158 similar to the integrated circuit 100 except that the integrated circuit 158 includes a SHE-MRAM eNVM device 160 ("SHE-MRAM device" for brevity) that is in electrical contact with other elements of the IC 158.

Many of the elements of the integrated circuit 158 are analogous to those shown in the integrated circuit 100, including the substrate 104, the device layer 112, ILD 106, interconnect layers 130, 132, 150, and interconnect structures 128, 131, and 152. These elements need no further explanation.

Unlike the integrated circuit 100, the integrated circuit include the SHE-MRAM device 160, which in turn includes a spin filter 164, a free layer 168, a barrier layer 172 and a reference layer 176.

SHE-MRAM devices relies on the "spin Hall effect" in which electrons with different spins can be directed into different directions as a result of the different angular momentum of the different spins. The effect can be used to control current applied to various layers within the SHE-MRAM 160.

The spin filter 164 is used to "polarize" (i.e., preferentially impart one type of spin (e.g., "up") onto a majority of electrons compared to a second type of spin (e.g., "down"). In examples, the spin filter 164 can be fabricated from any of the following: β-Tantalum (β-Ta); β-Tungsten (β-W); platinum (Pt); a Ag/Bi bilayer; BiSe; $MoS_2$; and Cu doped with Bi, iridium (Ir), tungsten (W), or any of the elements of 3d, 4d, 5d and 4f, 5f periodic groups in the Periodic Table which may exhibit high spin orbit coupling. The spin filter 164 can be deposited using any of a variety of techniques including, but not limited to, chemical vapor deposition, organometallic chemical vapor deposition, atomic layer deposition, sputtering, among other deposition techniques.

The free layer 168 is, like the reference layer 176 described below, fabricated from a magnetic material, and in particular a ferromagnetic material. However, in some examples the material of the free layer 168 is selected to have a lower magnetic coercivity than that of the reference layer 176, and thus can be magnetized or demagnetized with less force needed compared to high coercivity materials. In some examples, the free layer 168 can be fabricated from cobalt iron (CoFe) or cobalt iron boron (CoFeB). The free layer 168 can be deposited using any of a variety of techniques including, but not limited to, chemical vapor deposition, organometallic chemical vapor deposition, atomic layer deposition, sputtering, among other deposition techniques.

The barrier layer 172 provides a resistive barrier between the free layer 168 and the reference layer 176. Upon application of a sufficient electrical field, a difference in resistance between the free layer 168 and the reference layer 176 can be identified so as to read data from the SHE-MRAM device 160. In some examples, the barrier layer 172 is fabricated from magnesium oxide (MgO) and is configured to enable selective tunneling of polarized electrons from the free layer 168 through the barrier layer 172 and into reference layer 176. The barrier layer 172 can be deposited using any of a variety of techniques including, but not limited to, chemical vapor deposition, organometallic chemical vapor deposition, atomic layer deposition, sputtering, among other deposition techniques.

The reference layer 176 can be a magnetic layer having a fixed magnetization. As indicated above in the context of the STT-MRAM, the reference layer 176 generally is fabricated from a material having a higher magnetic coercivity that the free layer 168. As such, the reference layer 176 can be fabricated from as a magnetized ferromagnetic material. In some examples, the reference layer 176 is fabricated from cobalt iron boron (CoFeB). In another example, the fixed magnetic layer is fabricated as a stack of a cobalt iron boron (CoFeB) layer, a ruthenium (Ru) layer, and another cobalt iron boron (CoFeB) layer. The reference layer 176 can be deposited using any of a variety of techniques including, but not limited to, chemical vapor deposition, organometallic chemical vapor deposition, atomic layer deposition, sputtering, among other deposition techniques.

While not shown, some examples of SHE-MRAM devices may include additional layers, such as a synthetic anti-ferro-magnet (SAF) (fabricated from CoFe and ruthenium), and an antiferromagnet layer.

FIG. 1C illustrates an integrated circuit 180 similar to the integrated circuits 100 and 158 except that the integrated circuit 180 includes RRAM eNVM device 184 ("RRAM device" for brevity) that is in electrical contact with other elements of the IC 180.

Many of the elements of the integrated circuit 180 are analogous to those shown in the integrated circuits 100 and 158, including the substrate 104, the device layer 112, ILD 106, interconnect layers 130, 132, 150, and interconnect structures 128, 131, and 152 and need no further explanation.

As indicated above, RRAM devices such as the one shown in FIG. 1C, stores a bit of data by changing an electrical resistance of the device using a memristor. The RRAM device can change a high-resistance state (HRS), which may be representative of an "off" or "0" bit and a low-resistance state (LRS), which may be representative of an "on" or "1" bit. The RRAM device 184 includes a first ($1^{st}$) electrode 186, a switching layer 188, an optional oxygen exchange layer (OEL) 190, and a second ($2^{nd}$) electrode 192.

The first electrode 186 and the second electrode 192 place the RRAM device 184 into electrical contact with other elements of the integrated circuit 180, including a corresponding transistor of this 1T/1R memory device. In some examples, the first electrode 186 and the second electrode 192 include at least one of: disulfur dinitride ($S_2N_2$); titanium nitride (TiN); tantalum nitride (TaN); copper (Cu); tungsten (W); titanium (Ti); one or more noble metals, such as ruthenium (Ru), rhodium (Rh), palladium (Pd), silver (Ag), osmium (Os), iridium (Ir), platinum (Pt), and gold (Au); and/or any other suitable material or combination of materials, as will be apparent in light of this disclosure.

The switching layer 188, which has a lower conductivity than either of the first electrode 186 or the second electrode 192, can improve the stability and/or retention of a bit stored within the RRAM device 184. The switching layer 188 can be fabricated from one or more of the following materials: a metal oxide, such as hafnium oxide ($HfO_x$), titanium oxide ($TiO_x$), nitrogen oxide ($NiO_x$), tungsten oxide ($WO_x$), tantalum oxide ($TaO_x$), zirconium oxide ($ZiO_x$), vanadium oxide ($VO_x$), copper oxide ($CuO_x$), aluminum oxide ($AlO_x$); a metal alloy oxide; and/or any other suitable material, as will be apparent in light of this disclosure.

In some embodiments, the optional oxygen exchange layer (OEL) 190, when present, may include at least one of: hafnium (Hf); titanium (Ti); tantalum (Ta); and/or any other suitable material or combination of materials. In some such embodiments, OEL 190 may be present in RRAM device 184 to, for example, increase flexibility in incorporating the other materials. For instance, in some embodiments, OEL 190 may be present to affect the switching mechanism of the RRAM device 184, such as to help provide a more stable switching mechanism, for example.

The materials of the switching layer 188 and the optional oxygen exchange layer 190 may be formed by, for example, any one or more of atomic layer deposition, chemical vapor deposition, organometallic chemical vapor deposition, among others.

In some embodiments one or more of the layers of the RRAM device 184 may have a multilayer structure. For instance, in some embodiments, switching layer 188 may include two material layers that may or may not include grading (e.g., increasing and/or decreasing) the content of at least one material throughout the multilayer structure.

Methodology and Architecture

Figure 3A:
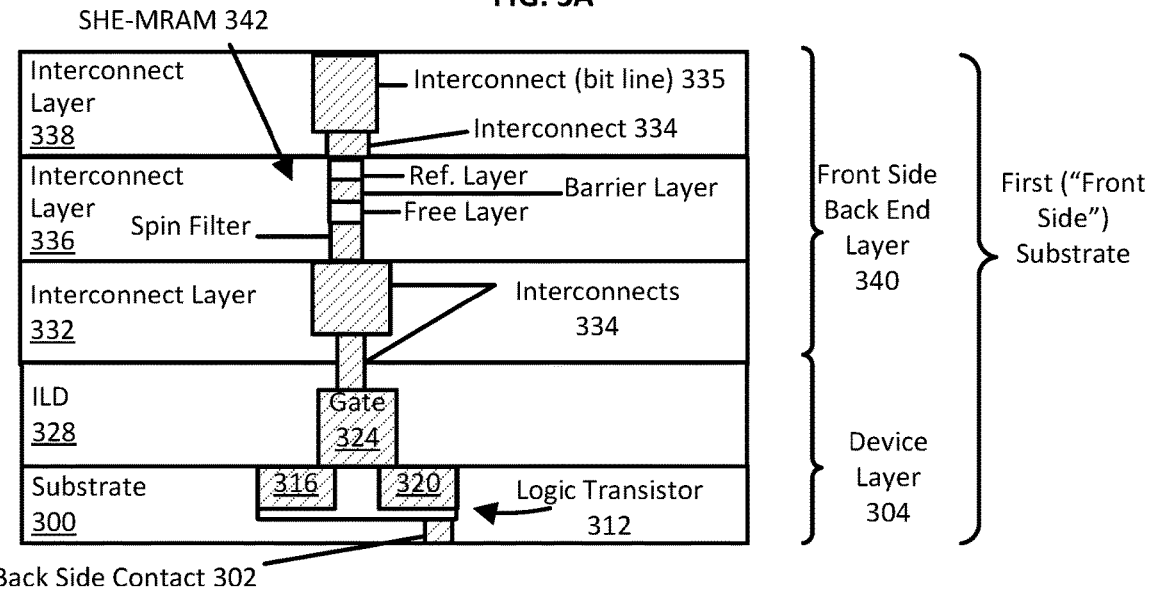
FIGS. 3A-C are cross-sectional views of a series of integrated circuit structures taken along a direction parallel to a gate of a transistor of an integrated circuit structure, the views illustrating formation an integrated circuit that includes an STT-MRAM eNVM device and a SHE-MRAM eNVM device fabricated on an opposite side of a device layer according to the method shown in FIG. 2, in accordance with an embodiment of the present disclosure.
Figure 3B:
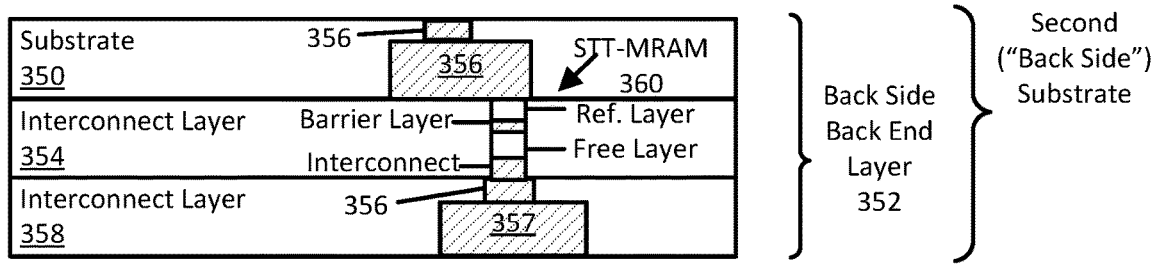
Figure 3C:
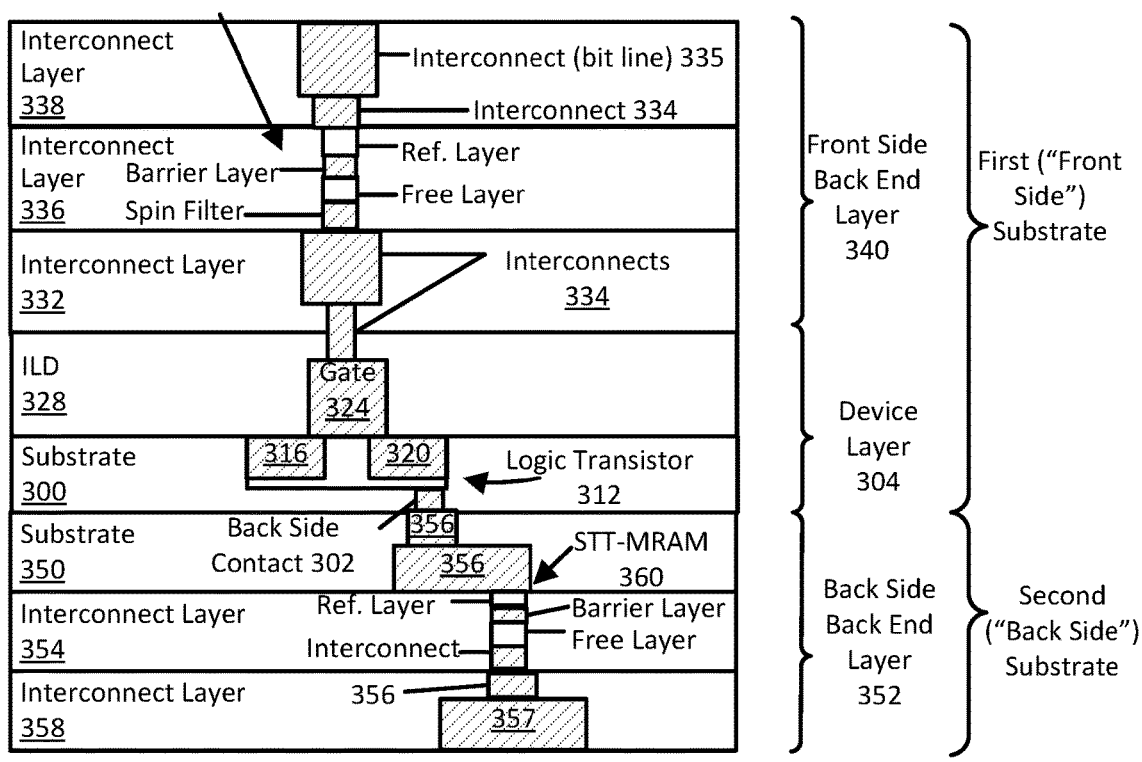

Having introduced various example eNVM device structures 102, 160, and 184 and the challenges regarding integration of more than one type of eNVM device on a substrate, a method 200 that includes using "metallization on both sides" ("MOBS") techniques is described in the context of FIG. 2, with concurrent reference to device cross-sectional views shown in FIGS. 3A-3C, for fabricating a monolithic integrated circuit that overcomes the challenges indicated above. The device cross-sectional views shown in FIGS. 3A-3C are taken parallel to a gate of a logic transistor.

The method 200 includes (1) a front side substrate sub-process 204 for fabricating a first type of eNVM device on a front side (or "first") substrate and (2) a back side (or "second") substrate sub-process 208 that includes fabricating a second type of eNVM device different from the first type on a back side substrate. The front side substrate and the back side substrate are then joined in a substrate joining sub-process 210, thus placing the first type of eNVM device on the front side substrate into electrical contact with the back side substrate and the second type of eNVM device thereon. The method 200 is described below in the context of each of these sub-processes 204, 208, and 210 for convenience. It will be appreciated that the following explanation is not intended to ascribe an order to the various sub-processes.

The front side substrate sub-process 204 of the method 200 begins by providing 216 a front side substrate 300 and forming 220 a device layer 304 thereon using any of the techniques described above in the context of the device layer 112 (e.g., patterning, ion implantation, deposition and/or growth of various conducting and semiconducting layers, deposition of an encapsulating ILD layer). As shown in FIG. 3A, the device layer includes a logic transistor 312 (that includes a source 316, a channel 318, a drain 320, and a gate 324) similar to the logic transistors shown in FIGS. 1A-1C and described above. The techniques can be used to form any configuration and/or any type of semiconductor device also described above in the context of the semiconductor device 108.

Furthermore, as part of forming 220 the device layer, and as a component of MOBS processing, a back side contact 302 shown in FIG. 3A is also formed 222. This back side contact 302 is disposed on a side of the device layer 304 that is opposite a side on which a back end layer 340 is formed, as described below. The back side contact 302, which can be a deep diffusion contact, is configured to enable electrical contact between one or more of the logic transistor 312, an interconnect of the front side substrate, and a eNVM device of the front side substrate and one or more of these on a back side substrate, as described below in more detail. The back side contact 302, as mentioned above, can be formed 222 by a deep diffusion contact in which a type of ion is implanted (and diffused) deep within the substrate so as to form a conductive region. Alternatively, the back side contact 302 can be formed 222 as a metal interconnect analogous to a via or metal line in an interconnect layer.

The device layer 304 of the front side substrate 300 is completed by encapsulating at least the logic transistor 312 in an ILD layer 328 and planarizing the ILD layer 328.

Interconnects 334, 335 are formed 224 in one or more interconnect layers 332, 336, 338. The interconnects 334, 335 and the interconnect layers 332, 336, 338 are formed 224 using any of the materials and/or techniques described above in the context of the back end layer 126, 156, 182 described above.

Continuing with FIG. 3A, a first type of eNVM device (i.e., one of SHE-MRAM, STT-MRAM, and RRAM) is formed 228 within at least one of the interconnect layers 332, 336, 338, again using any of the materials and deposition techniques already described above in the context of any of FIGS. 1A, 1B, and 1C. In the example shown in FIG. 3A, the first type of eNVM device is a SHE-MRAM device 342 in the interconnect layer 338. In some examples, the MTJ of the SHE-MRAM is disposed at "M3" (the third interconnect level above, or in some examples not shown, below a device layer) and a bit line is disposed at "M4" (whether above or below a device layer). A source line of the SHE-MRAM, is disposed at the first level of interconnect on the back side substrate 350. While the source line of the SHE-MRAM is omitted from FIGS. 3B and 3C for clarity, the arrangement of bit lines and source lines for the various eNVM devices of the present disclosure is shown in FIG. 4C and described below. It will be appreciated that any of the eNVM devices described above, among others, can be fabricated within the back end layer 340 of the front side substrate 300 using patterning and deposition techniques described above.

With reference to FIG. 3B, the back side substrate sub-process 208 beings by providing 215 a back side substrate 350 that can be a same or a different composition and/or structure as the front side substrate 300. For example, the front side substrate provided 216 could include a SOX substrate to enhance the performance of a semiconductor device thereon, whereas the back side substrate provided 215 may be a simple silicon single crystal substrate. Regardless, upon providing 215 the back side substrate 350, at least one interconnect layer 354, 358 (which include interconnects 356, interconnect bit line 357, an interconnect source line for the SHE-MRAM device 342 (omitted for clarity, but illustrated in FIG. 4C) and ILD) is formed 223 on the back side substrate 350. At least one of the interconnects formed 223 is configured to be placed into electrical contact with the back side contact 302 of the front side substrate 300.

Also within at least one of the interconnect layer 354, 358 is a second type of eNVM device different from the first type of device, in this case an STT-MRAM device 360, is formed 227 using patterning and deposition techniques described above. In an example, a bit line 357 and MTJ corresponding to the STT-MRAM device 360 correspond to M-2 and M-3 of the back side substrate, respectively. Because the bit lines 335, 357 of the SHE-MRAM 342 and STT-MRAM 360 devices, respectively, are on physically separate interconnect layers of the front side substrate and back side substrate, respectively, thus using different interconnect layers and structures, the resistances of each interconnect structure can be optimized for the corresponding device. Source lines (not shown in FIG. 3A-3C for clarity, but illustrated in FIG. 4C) for each device are similarly disposed on different interconnect layers and thus may also be optimized for performance of the corresponding device.

The substrate joining sub-process 210 is performed so as to place the front side substrate 300 and the back side substrate 350, and the two different types of eNVM devices thereon, into electrical contact. In one example, this can be accomplished by first removing 236 bulk substrate material from the exposed substrate 300 surface so as to expose the back side contact 302. This has the effect preserving the front side back end layer 340 and exposing the back side contact 302 for subsequent electrical contact with a back side substrate 350.

Removing material can be accomplished by one or more of grinding, etching, and/or chemical mechanical polishing/planarizing (CMP), with or without the use of an etch stop layer (e.g., a crystalline or amorphous insulator like silicon on insulator (SOI), for example). Such a substrate material removal process is colloquially referred to as "back side reveal," as it reveals the back side or underside of the device layer. The subsequent processing can include forming additional contact trenches in the revealed back side and depositing metal contacts in the back side contact trenches using patterning techniques described above.

The front side substrate 300 and the backside substrate 350 are then placed 240 into electrical contact using, for example, the back side contact 302 and a corresponding interconnect 356. Various other elements of the substrate joining process 210 may be performed (e.g., adhering the front side substrate 300 and the back side substrate 350, although these need not be discussed herein. The configuration in FIG. 3C can be described as placing a back side interconnect layer "below" the device layer shown in FIG. 3A as viewed in the vertical cross-sections of FIGS. 3A-3C. As indicated above, "below," "above" and similar orientation terminology are for convenience of description only and are used to describe relative location of various devices conveniently in the context of the examples illustrated in the figures.

As described above, one benefit of embodiments described herein is the ability to connect each of the two eNVM devices to low resistance, dimensionally large interconnects. This benefit is also evident upon inspection of FIG. 3C. As shown, the free layer of the SHE-MRAM device 342 is connected to an interconnect bit line 335 and the free layer of the STT-MRAM 360 is connected, via an intervening spin filter, to an interconnect bit line 357. Thus, the performance of each of the two eNVM devices shown in FIG. 3C is improved by using low resistance interconnects 335, 357 to read data from and write data to each of the eNVM devices 342, 360.

Figure 4A:
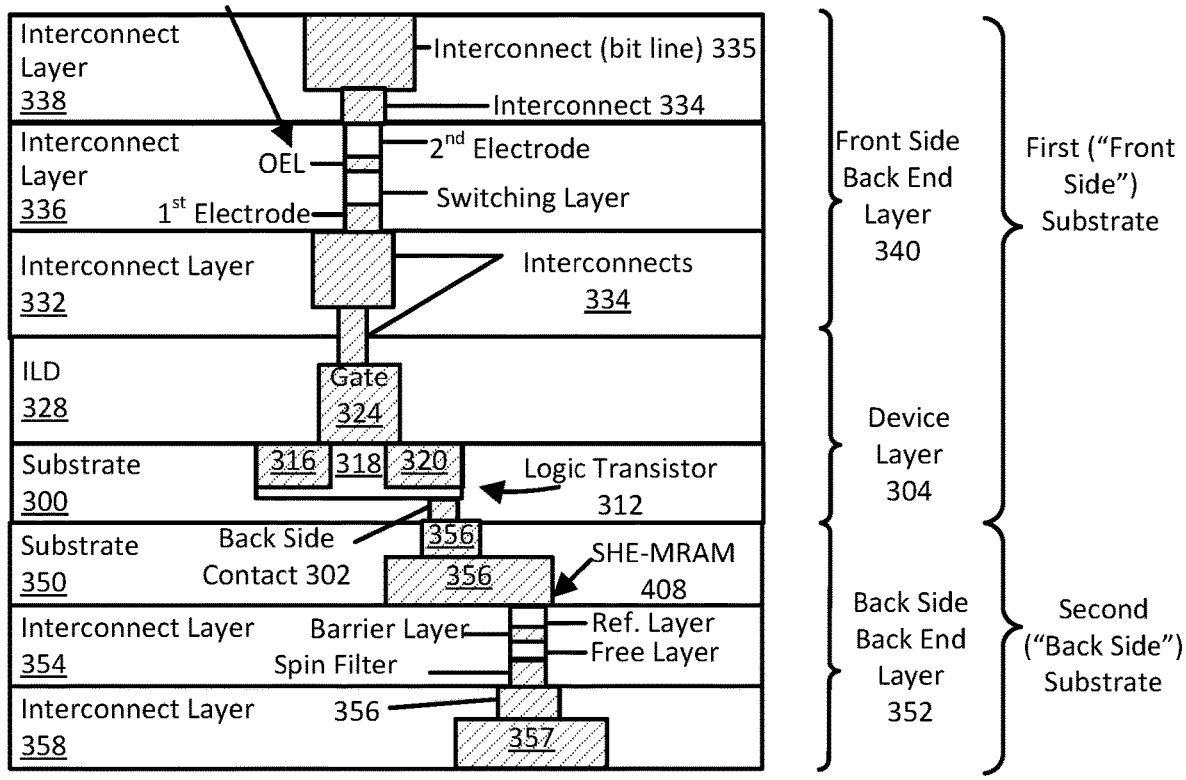
FIG. 4A is a cross-sectional view taken along a direction parallel to a gate of a transistor of an integrated circuit fabricated according to the method shown in FIG. 2 that includes an STT-MRAM device and an RRAM device, in accordance with another embodiment of the present disclosure.
Figure 4B:
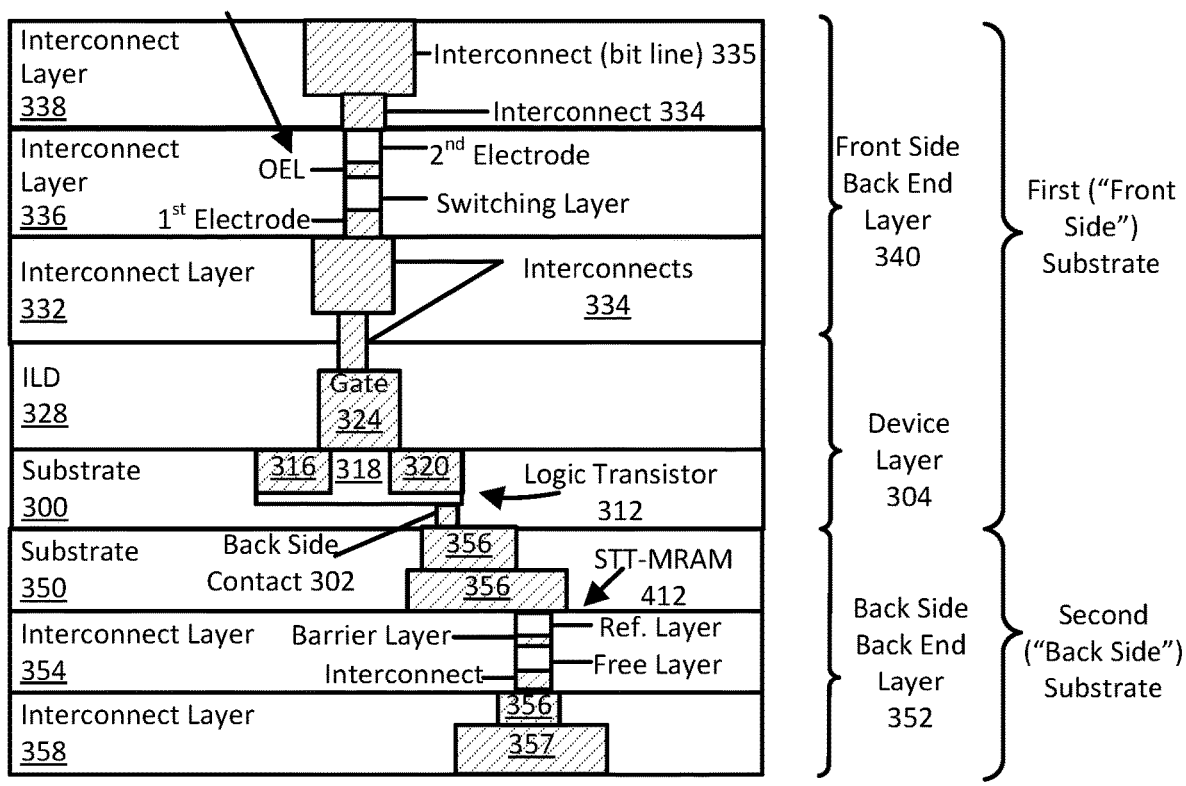
FIG. 4B is a cross-sectional view taken along a direction parallel to a gate of a transistor of an integrated circuit fabricated according to the method shown in FIG. 2 that includes an SHE-MRAM device and an RRAM device, in accordance with another embodiment of the present disclosure.
Figure 4C:
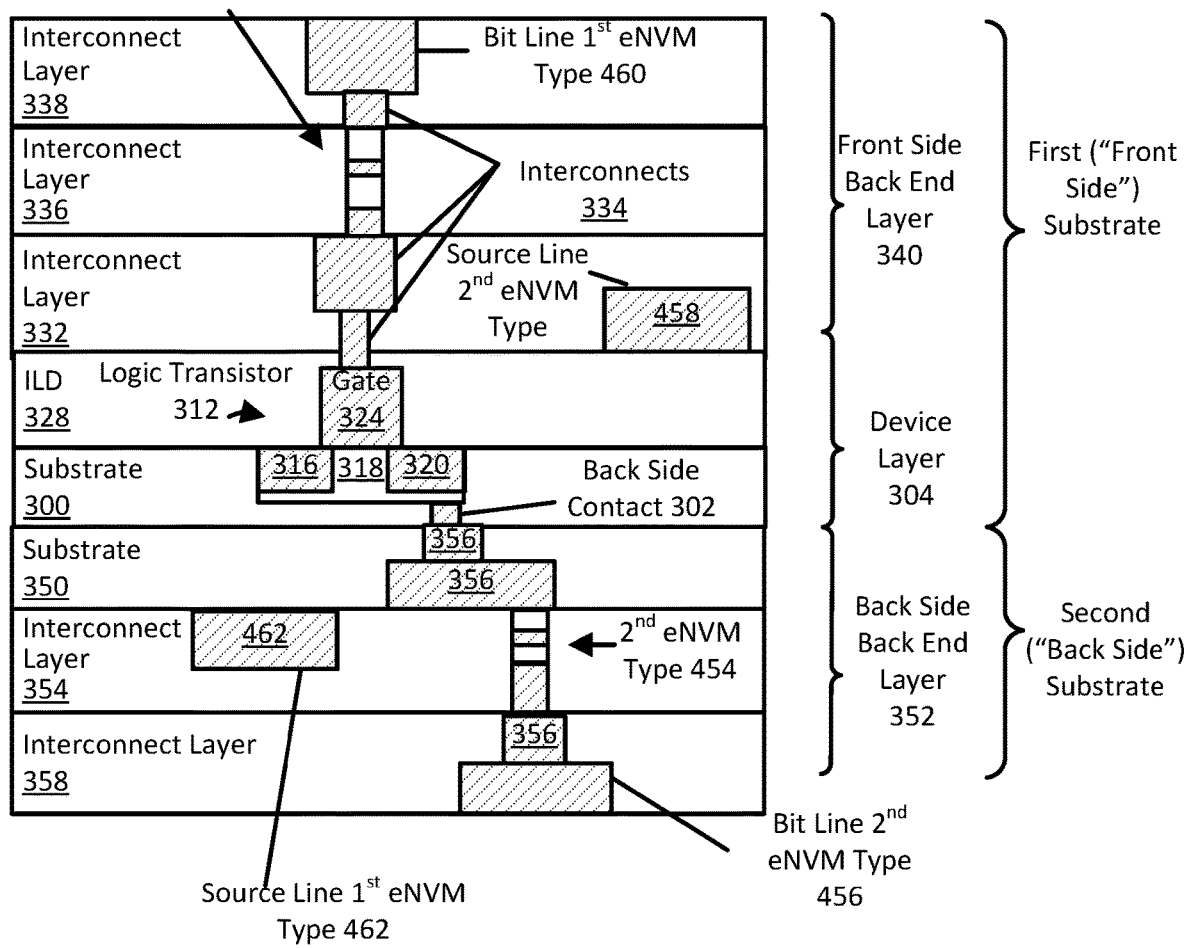
FIG. 4C is a cross-sectional view taken along a direction parallel to a gate of a transistor of an integrated circuit fabricated according to the method shown in FIG. 2 that illustrates a location of a source line and a bit line corresponding to each of the first eNVM device type and the second eNVM device type, in accordance with an embodiment of the present disclosure.

FIGS. 4A and 4B each show a different combination of devices prepared using the method 200. FIG. 4A illustrates an RRAM device 404 and an SHE-MRAM device 408 integrated together. FIG. 4B illustrates an RRAM device 404 and a STT-MRAM device 412 integrated together. A bit line 335 connects to the RRAM device 404 via the second electrode. A bit line 337 connects to the STT-MRAM device 412 via the free layer. The fabrication of the monolithic integrated circuits shown in FIGS. 4A and 4B, and the devices depicted therein, will be apparent upon reading the present disclosure and needs no further explanation.

FIG. 4C illustrates the arrangement of the first type of eNVM device 450 on the front side substrate 300, the second type of eNVM device 454 on the back side substrate 350, and corresponding source lines and bit lines for each device. As indicated above, including more than one type of eNVM device on a single substrate poses challenges because the various interconnects (e.g., source lines and bit lines) for the different types of devices may compete with one another for limited space within a back end layer. Embodiments described herein can overcome this challenge using the MOBS techniques described above, as illustrated in FIG. 4C and further allow resistances of bit lines and source lines associated with the first type of eNVM device 450 and the second type of eNVM device 454 to be optimized separately, thus improving individual eNVM device performance and performance of the IC as a whole.

As shown, competition between the various source lines and bit lines of the first eNVM device type 450 and the second eNVM device type 454 is resolved by disposing the bit line 460 for the first eNVM device type 450 in the interconnect layer 338 of the front side substrate 300 and the source line 462 for the first eNVM device type 450 in the interconnect layer 354 of the substrate 350. Similarly, a source line 458 for the second eNVM device type 454 is disposed in interconnect layer 332 of the first substrate 300 and a bit line 456 for the second eNVM device type 454 is disposed in the interconnect layer 358 of the back side substrate 350. Thus, by disposing a bit line and a source line for each device on separate substrates, the competition between the different types of devices for space within interconnect layers is resolved.

Use of the techniques and structures provided herein may be detectable using tools such as: electron microscopy including scanning/transmission electron microscopy (SEM/TEM), scanning transmission electron microscopy (STEM), and reflection electron microscopy (REM); composition mapping; x-ray crystallography or diffraction (XRD); energy-dispersive x-ray spectroscopy (EDS); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate the presence of two different types of eNVM devices within a same monolithic integrated circuit fabricated using MOBS techniques.

Example System

Figure 5:
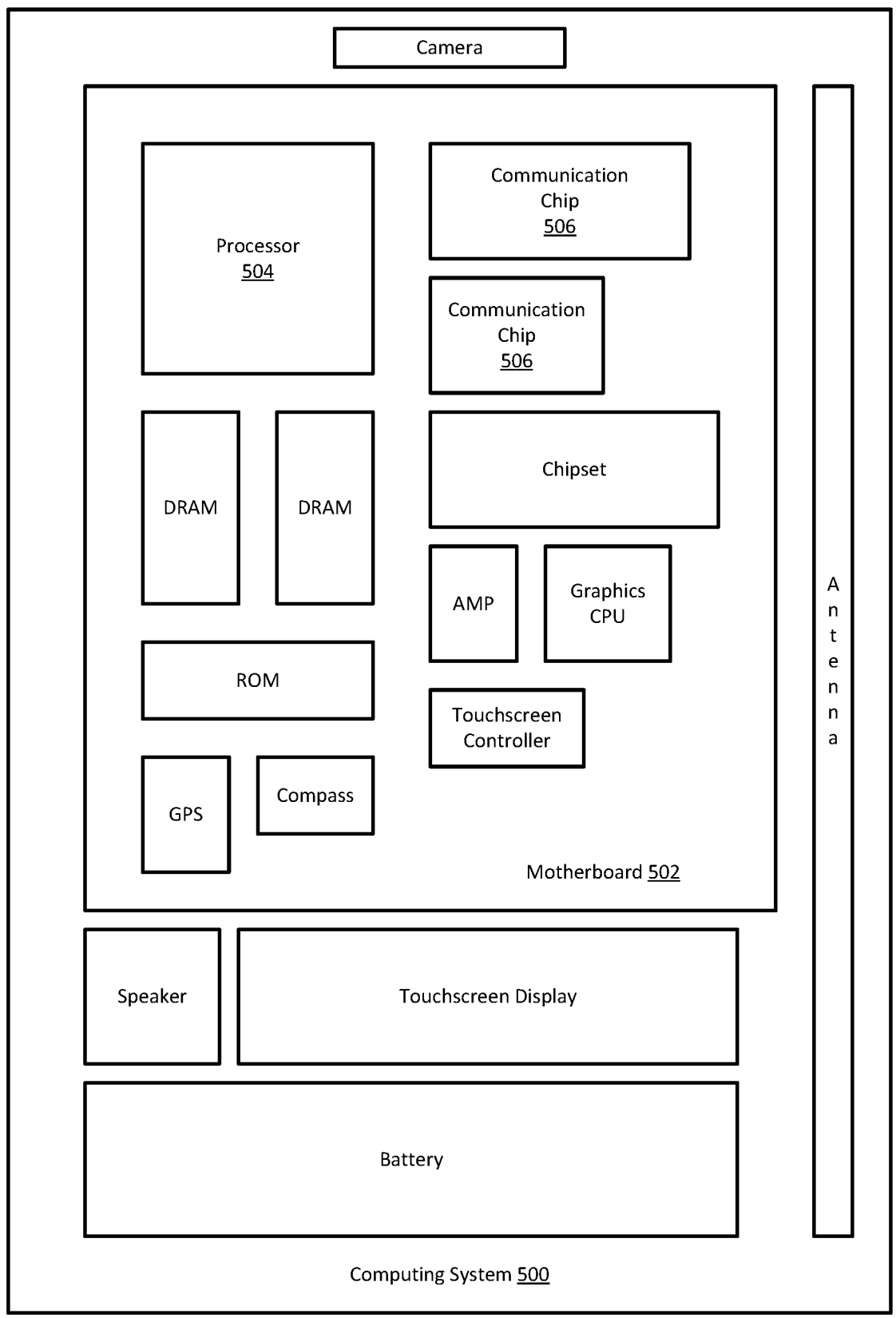
FIG. 5 is a depiction of a computing system configured in accordance with an embodiment of the present disclosure.

FIG. 5 is an example computing system implemented with one or more of the integrated circuit structures and embedded non-volatile memory devices as disclosed herein, in accordance with some embodiments of the present disclosure. As can be seen, the computing system 500 houses a motherboard 502. The motherboard 502 may include a number of components, including, but not limited to, a processor 504 and at least one communication chip 506, each of which can be physically and electrically coupled to the motherboard 502, or otherwise integrated therein. As will be appreciated, the motherboard 502 may be, for example, any printed circuit board, whether a main board, a daughterboard mounted on a main board, or the only board of system 500, etc.

Depending on its applications, computing system 500 may include one or more other components that may or may not be physically and electrically coupled to the motherboard 502. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 500 may include one or more integrated circuit structures or devices configured in accordance with an example embodiment (e.g., to include at least two different types of eNVM devices, as variously provided herein). In some embodiments, multiple functions can be integrated into one or more chips (e.g., for instance, note that the communication chip 506 can be part of or otherwise integrated into the processor 504).

The communication chip 506 enables wireless communications for the transfer of data to and from the computing system 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others. In some embodiments, communication chip 506 may include one or more transistor structures having a gate stack an access region polarization layer as variously described herein.

The processor 504 of the computing system 500 includes an integrated circuit die packaged within the processor 504. In some embodiments, the integrated circuit die of the processor includes onboard circuitry that is implemented with one or more integrated circuit structures or devices as variously described herein. The term "processor" may refer to any device or portion of a device that processes, for instance, electronic data from registers and/or memory to transform that electronic data into other electronic data that may be stored in registers and/or memory.

The communication chip 506 also may include an integrated circuit die packaged within the communication chip 506. In accordance with some such example embodiments, the integrated circuit die of the communication chip includes one or more integrated circuit structures or devices as variously described herein. As will be appreciated in light of this disclosure, note that multi-standard wireless capability may be integrated directly into the processor 504 (e.g., where functionality of any chips 506 is integrated into processor 504, rather than having separate communication chips). Further note that processor 504 may be a chip set having such wireless capability. In short, any number of processor 504 and/or communication chips 506 can be used. Likewise, any one chip or chip set can have multiple functions integrated therein.

In various implementations, the computing system 500 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 includes a monolithic integrated circuit, comprising: a device layer including one or more logic transistors; a front side interconnect layer above the device layer, as seen in a vertical cross-section taken through the monolithic integrated circuit from top to bottom; a back side interconnect layer below the device layer, as seen in the vertical cross-section; a first type of non-volatile memory device in the front side interconnect layer; and a second type of non-volatile memory device different from the first type of non-volatile memory device in the back side interconnect layer.

Example 2 includes the subject matter of Example 1, wherein at least one of the first type of non-volatile memory device and the second type of non-volatile memory device includes a magnetic tunnel junction transistor.

Example 3 includes the subject matter of either of Example 1 or Example 2, wherein at least one of the first type of non-volatile memory device and the second type of non-volatile memory device comprises a spin hall effect magneto-resistive random access memory device (SHE-MRAM), the SHE-MRAM device comprising a reference layer, a free layer, a barrier layer disposed between the reference layer and the free layer, and a spin filter on a side of the free layer opposite the barrier layer.

Example 4 includes the subject matter of Example 3, wherein the spin filter is fabricated from any of the following: β-Tantalum (β-Ta); β-Tungsten (β-W); platinum (Pt); a Ag/Bi bilayer; BiSe; $MoS_2$; and Cu doped with Bi, iridium (Ir), tungsten (W).

Example 5 includes the subject matter of any of Examples 1 through 4, wherein the reference layer is fabricated from a first magnetic material having a first coercivity; and the free layer is fabricated from a second magnetic material having a second coercivity less than the first coercivity.

Example 6 includes the subject matter of Example 5, wherein the first magnetic material and the second magnetic material are both alloys of cobalt and iron.

Example 7 includes the subject matter of any of Examples 3 to 6, further comprising a bit line electrically connected to the SHE-MRAM memory device via the free layer.

Example 8 includes the subject matter of Example 2, wherein the magnetic tunnel junction transistor is disposed at a third interconnect layer either above or below the device layer; and a bit line is disposed at a fourth interconnect layer either above or below the device layer.

Example 9 includes the subject matter of either of Examples 1 or 2, wherein one of the first type of non-volatile memory device and the second type of non-volatile memory device comprises a spin torque transfer magneto-resistive random access memory device (STT-MRAM) comprising a free layer, a barrier layer, and a reference layer.

Example 10 includes the subject matter of Example 9, wherein the reference layer is fabricated from a third magnetic material having a third coercivity; and the free layer is fabricated from a fourth magnetic material having a fourth coercivity less than the third coercivity.

Example 11 includes the subject matter of Example 10, wherein the third magnetic material and the fourth magnetic material are both alloys of cobalt and iron.

Example 12 includes the subject matter of any of Examples 9 to 11, further comprising a bit line electrically connected to the STT-MRAM device via the free layer.

Example 13 includes the subject matter of Examples 9 to 12, wherein a magnetic tunnel junction transistor of the STT-MRAM device is disposed at a second interconnect layer; and a bit line connected to the STT-MRAM device is at a third interconnect layer.

Example 14 includes the subject matter of any of Examples 1 to 13, wherein one of the first type of non-volatile memory device and the second type of non-volatile memory device comprises a resistive random access memory (RRAM) device.

Example 15 includes the subject matter of Example 14, wherein the RRAM device comprises: a first electrode; a second electrode; and a switching layer between the first electrode and the second electrode.

Example 16 includes the subject matter of Example 15, further comprising an oxygen exchange layer between the switching layer and the second electrode.

Example 17 includes the subject matter of Example 15, further comprising a bit line connected to the RRAM device via the second electrode.

Example 18 includes the subject matter of any of Examples 1 to 17, further comprising: a first bit line connected to the first type of non-volatile memory device, the first bit line in a front side interconnect layer above the device layer but different from the front side interconnect layer containing the first type of non-volatile memory device; and a second bit line connected to the second type of non-volatile memory device, the second bit line in a back side interconnect layer below the device layer but different from the back side interconnect layer containing the second type of non-volatile memory device.

Example 19 includes the subject matter of any of Examples 1 to 18, further comprising: a first source line connected to the first type of non-volatile memory device, the first source line in a back side interconnect layer below the device layer; and a second source line connected to the second type of non-volatile memory device, the second source line in a front side interconnect layer above the device layer.

Example 20 includes the subject matter of any of Examples 1 to 19, wherein the device layer further includes a back side contact that electrically couples a logic transistor of the device layer to a back side interconnect layer below the device layer.

Example 21 includes a computing device that includes the subject matter of any of Examples 1 to 20.

Example 22 includes a method comprising forming a device layer on a first substrate, the device layer including a logic transistor and a back side contact; forming at least one front side interconnect layer above the device layer, the at least one interconnect layer including a first type of non-volatile memory device; forming at least one back side interconnect layer on a second substrate, the at least one back side interconnect layer including a second type of non-volatile memory device different from the first type of non-volatile memory device; and connecting a logic transistor of the device layer to the back side interconnect layer via the back side contact.

Example 23 includes the subject matter of Example 22, wherein the first type of non-volatile memory device is one of a SHE-MRAM, STT-MRAM, and RRAM and wherein the second type of non-volatile memory device is one of the SHE-MRAM, STT-MRAM, and RRAM not the same as the first type of non-volatile memory device.

Example 24 includes the subject matter of either of Examples 22 or 23, further comprising forming a bit line in a front side interconnect layer above the device layer that is connected to the first type of non-volatile memory device; and forming a bit line in a back side interconnect layer below the device layer that is connected to the second type of non-volatile memory device.

Example 25 includes the subject matter of any of Examples 22 to 24 further comprising forming a source line in a back side interconnect layer below the device layer that is connected to the first type of non-volatile memory device; and forming a source line in a front side interconnect layer above the device layer that is connected to the second type of non-volatile memory device.

Example 26 includes the subject matter of any of Examples 22 to 25 wherein connecting a logic transistor of the device layer to the back side interconnect layer via the back side contact includes removing one of the first or second substrates.

Example 27 includes the subject matter of any of Examples 22 to 26 further comprising removing bulk substrate material from a back side of the first substrate prior to connecting the logic transistor of the device layer to the back side interconnect layer via the back side contact.

What is claimed is:

1. A monolithic integrated circuit, comprising:
   a device layer including one or more logic transistors;
   a front side interconnect layer above the device layer;
   a back side interconnect layer below the device layer;
   a first type of non-volatile memory device in the front side interconnect layer above the device layer;
   a first source line for the first type of non-volatile memory device, the first source line below the device layer;
   a second type of non-volatile memory device in the back side interconnect layer below the device layer, the second type of non-volatile memory device different from the first type of non-volatile memory device; and
   a second source line for the second type of non-volatile memory device, the second source line above the device layer,
   wherein at least one of the first or second types of non-volatile memory devices is connected to a gate of a logic transistor of the one or more logic transistors.

2. The monolithic integrated circuit of claim 1, wherein at least one of the first type of non-volatile memory device and the second type of non-volatile memory device includes a magnetic tunnel junction transistor.

3. The monolithic integrated circuit of claim 1, wherein at least one of the first type of non-volatile memory device and the second type of non-volatile memory device comprises a spin hall effect magneto-resistive random access memory device (SHE-MRAM), the SHE-MRAM device comprising a reference layer, a free layer, a barrier layer disposed between the reference layer and the free layer, and a spin filter on a side of the free layer opposite the barrier layer.

4. The monolithic integrated circuit of claim 3, wherein the spin filter is fabricated from any of the following: β-Tantalum (β-Ta); β-Tungsten (β-W); platinum (Pt); a Ag/Bi bilayer; BiSe; $MoS_2$; and Cu doped with Bi, iridium (Ir), tungsten (W).

5. The monolithic integrated circuit of claim 4, wherein:
   the reference layer is fabricated from a first magnetic material having a first coercivity; and
   the free layer is fabricated from a second magnetic material having a second coercivity less than the first coercivity.

6. The monolithic integrated circuit of claim 5, wherein the first magnetic material and the second magnetic material are both alloys of cobalt and iron.

7. The monolithic integrated circuit of claim 3, further comprising a bit line electrically connected to the SHE-MRAM memory device via the free layer.

8. The monolithic integrated circuit of claim 2, wherein:
   the magnetic tunnel junction transistor is disposed at a third interconnect layer either above or below the device layer; and
   a bit line is disposed at a fourth interconnect layer either above or below the device layer.

9. The monolithic integrated circuit of claim 1, further comprising:
   a first bit line connected to the first type of non-volatile memory device, the first bit line in a front side interconnect layer above the device layer but different from the front side interconnect layer containing the first type of non-volatile memory device; and
   a second bit line connected to the second type of non-volatile memory device, the second bit line in a back side interconnect layer below the device layer but different from the back side interconnect layer containing the second type of non-volatile memory device.

10. The monolithic integrated circuit of 1, wherein: the first source line is in the back side interconnect layer below the device layer; and
   the second source line in the front side interconnect layer above the device layer.

11. The monolithic integrated circuit of claim 1, wherein the device layer further includes a back side contact that electrically couples a logic transistor of the device layer to a back side interconnect layer below the device layer.

12. A monolithic integrated circuit, comprising:
   a device layer including one or more logic transistors, wherein each of the one or more logic transistors comprises a corresponding source, a corresponding drain, and a corresponding gate;
   a front side interconnect layer above the device layer;
   a back side interconnect layer below the device layer;
   a first type of non-volatile memory device in the front side interconnect layer above the device layer; and
   a second type of non-volatile memory device in the back side interconnect layer below the device layer, the second type of non-volatile memory device different from the first type of non-volatile memory device;
   wherein the first type of non-volatile memory device is connected to a first one of a source, a drain, or a gate;
   wherein the second type of non-volatile memory device is connected to a second one of the source, the drain, or the gate;
   wherein the second one of the source, drain, or gate is different from the first one of the source, drain, or gate; and
   wherein at least one of the first one of the source, drain, or gate or the second one of the source, drain, or gate is the gate.

13. The monolithic integrated circuit of claim 12, wherein:
   one of the first type of non-volatile memory device and the second type of non-volatile memory device comprises a spin torque transfer magneto-resistive random access memory device (STT-MRAM) comprising a free layer, a barrier layer, and a reference layer;
   the reference layer is fabricated from a third magnetic material having a third coercivity; and the free layer is fabricated from a fourth magnetic material having a fourth coercivity less than the third coercivity.

14. The monolithic integrated circuit of claim 13, wherein the third magnetic material and the fourth magnetic material are both alloys of cobalt and iron.

15. The monolithic integrated circuit of claim 12, wherein:
one of the first type of non-volatile memory device and the second type of non-volatile memory device comprises a spin torque transfer magneto-resistive random access memory device (STT-MRAM) comprising a free layer, a barrier layer, and a reference layer; and
the monolithic integrated circuit further comprising a bit line electrically connected to the STT-MRAM device via the free layer.

16. The monolithic integrated circuit of claim 13, wherein:
a magnetic tunnel junction transistor of the STT-MRAM device is disposed at a second interconnect layer; and
a bit line connected to the STT-MRAM device is at a third interconnect layer.

17. A monolithic integrated circuit, comprising:
a device layer including one or more logic transistors, wherein each of the one or more logic transistors comprises a corresponding source, a corresponding drain, and a corresponding gate;
a first side interconnect layer above the device layer;
a second side interconnect layer below the device layer;
a first type of non-volatile memory device in the first side interconnect layer; and
a second type of non-volatile memory device in the second side interconnect layer, the second type of non-volatile memory device different from the first type of non-volatile memory device,
wherein one of the first or second type of non-volatile memory device is connected to a gate.

18. The monolithic integrated circuit of claim 17, wherein one of the first type of non-volatile memory device and the second type of non-volatile memory device comprises a resistive random access memory (RRAM) device, and wherein the RRAM device comprises:
a first electrode;
a second electrode; and
a switching layer between the first electrode and the second electrode.

19. The monolithic integrated circuit of claim 18, further comprising:
an oxygen exchange layer between the switching layer and the second electrode; and
a bit line connected to the RRAM device via the second electrode.

20. The monolithic integrated circuit of claim 17, wherein another of the first or second type of non-volatile memory device is connected one of a source or a drain.

* * * * *